US006542068B1

United States Patent
Drapp et al.

(10) Patent No.: US 6,542,068 B1
(45) Date of Patent: Apr. 1, 2003

(54) VERTICAL HALL EFFECT SENSOR AND A BRUSHLESS ELECTRIC MOTOR HAVING A VERTICAL HALL EFFECT SENSOR

(75) Inventors: Axel Drapp, Biel (CH); André Bietry, Bonfol (CH); Frédéric Burger, Genéve (CH); Radivoje Popovic, St-Sulpice (CH)

(73) Assignee: Myonic AG (CH)

( * ) Notice: Subject to any disclaimer, the term of this patent is extended or adjusted under 35 U.S.C. 154(b) by 0 days.

(21) Appl. No.: 09/674,123

(22) PCT Filed: Apr. 19, 1999

(86) PCT No.: PCT/CH99/00156

§ 371 (c)(1),
(2), (4) Date: Dec. 14, 2000

(87) PCT Pub. No.: WO99/56381

PCT Pub. Date: Nov. 4, 1999

(30) Foreign Application Priority Data

Apr. 27, 1998 (EP) .......................................... 98810370

(51) Int. Cl.$^7$ ............................................. H01L 43/10
(52) U.S. Cl. ...................... 338/32 H; 257/425; 360/112
(58) Field of Search ....................... 338/32 H; 257/425; 360/112

(56) References Cited

U.S. PATENT DOCUMENTS

| 3,202,913 | A | * | 8/1965 | Marinace | .................. | 338/32 H |
| 3,988,654 | A | | 10/1976 | Takahashi et al. | | |
| 4,028,718 | A | * | 6/1977 | Migitaka et al. | .......... | 338/32 H |
| 4,987,467 | A | | 1/1991 | Popovic | | |
| 5,151,764 | A | * | 9/1992 | Suzuki et al. | ................ | 257/425 |
| 5,173,758 | A | * | 12/1992 | Heremans | ................... | 257/425 |

FOREIGN PATENT DOCUMENTS

| EP | 0441554 | * | 8/1991 | ............... | 338/32 H |
| JP | 5884478 | * | 5/1983 | ............... | 338/32 H |
| JP | 59117182 | * | 7/1984 | ............... | 338/32 H |
| JP | 60154582 | * | 8/1985 | ............... | 338/32 H |

OTHER PUBLICATIONS

Paranjape, M. et al., "A CMOS–compatible 2–D vertical Hall magnetic–field sensor using active carrier confinement and post–process micromachining," 1996, pp. 278–282.
Ellerthorpe, Scott, "Effects of Software Speed–Control Algorithms on Low–Cost Six–Step Brushless DC Drives," Jan. 1996, pp. 58–65.
Nakamura, T. et al., "Integrated Magentic Sensors," Mar. 1990, pp. 762–769.
Roumenin, Ch. S., "Parallel–field Hall microsensors: an overview," Jan. 1992, pp. 77–87.

* cited by examiner

*Primary Examiner*—Karl Easthom
(74) *Attorney, Agent, or Firm*—Webb Ziesenheim Logsdon Orkin & Hanson, P.C.

(57) ABSTRACT

A vertical Hall sensor includes a semiconductor crystal with three or more arm sections that are arranged at a uniform angle distance to each other. A central electrode and external current electrodes are arranged on the surface of the sensor, and a plurality of Hall voltage contacts is arranged therebetween. The semiconductor crystal is thick enough for a current flow to pass between the electrodes in each arm section of the semiconductor crystal, whereby the current flow produces several sensitivities in the Hall sensor corresponding to the number of arm sections with a correspondingly predefined angular dependency for a magnetic field that is directed in a parallel position with respect to the surface. The Hall voltages, which can be produced using one such multi-arm vertical Hall sensor, can be used in a reinforced and direct manner as an output signal for an electric motor.

7 Claims, 4 Drawing Sheets

VERTICAL HALL EFFECT SENSOR AND A BRUSHLESS ELECTRIC MOTOR HAVING A VERTICAL HALL EFFECT SENSOR

BACKGROUND OF THE INVENTION

1. Field of the Invention

The invention relates to a vertical Hall effect sensor comprising a semiconductor crystal having a pair of current electrodes arranged on its surface and having a Hall effect voltage contact arranged between the current electrodes, wherein the semiconductor crystal has sufficient thickness to allow a current flow between the current electrodes in the semiconductor crystal, which current flow makes the Hall effect sensor sensitive to a magnetic field aligned parallel to the surface.

The invention also relates to a brushless electric motor having at least one Hall effect sensor and having a permanent magnet, wherein the permanent magnet is connected to the motor shaft such that they rotate together, and the Hall effect sensor is arranged opposite this permanent magnet, and wherein the electric motor has at least three coils.

2. Description of the Prior Art

A vertical Hall effect sensor is disclosed in U.S. Pat. No. 4,987,467. Vertical hall effect sensors are integrated Hall effect sensors and have the advantage of being sensitive to a magnetic field parallel to the chip surface. Such Hall effect sensors are used in particular for accurate measurements of magnetic fields. A further Hall effect sensor is known from the article "A CMOS-compatible 2-D vertical Hall magnetic-field sensor using actice [sic] carrier confinement and post-process micromachining" by Paranjape et al. in Sensors and Actuators A, Volume A53, No. 1/03, May 1996 (1996-05), pages 278 to 282, XP000620310. This is a traditional 2-D Hall effect sensor, in which two Hall effect sensors are arranged in a cruciform shape with respect to one another such that they can use a common central contact.

Known, conventional Hall effect sensors are also used for controlling electric motors. A corresponding brushless electric motor with the associated controller is known from the article "Effects of Software Speed-Control Algorithm on Low-Cost Six-Step Brushless DC Drives" by S. Ellerthorpe in Power Conversion-&-Intelligent Motion, Volume 22, No. 1, pages 58 to 65 (January 1996). Another brushless electric motor, which uses three separate Hall effect sensors, is known from U.S. Pat. No. 3,988,654.

In the said motor, three Hall effect sensors, which each cover 180° of a circular disk parallel to the permanent magnet, are arranged with an offset of 120° to one another so that the voltages produced by these Hall effect sensors result in a three-bit feedback signal which defines the rotor position with respect to six 60° areas. The information relating to this is used in IP, PI and PPI controllers to achieve a constant speed from the electric motor.

These motors have the disadvantage that the corresponding systems which carry out the control algorithms have a space requirement that severely limits the capabilities to miniaturize the motors. The arrangement of the Hall effect sensors in respect to one another is difficult with regard to the aligned planarity and with regard to the accurate alignment of the angles.

Against the background of this prior art, the invention is based on the object of designing a vertical Hall effect sensor of the type mentioned initially such that it allows better angular resolutions to be achieved, and in particular such that three Hall effect voltages, respectively shifted through 120°, can be produced when a rotating magnetic field is applied.

A further object of the invention against the background of the said prior art is to design an electric motor equipped with a vertical Hall effect sensor such that this electric motor can be configured as a micromotor with as small a space requirement and as simple actuation as possible.

SUMMARY OF THE INVENTION

The first-mentioned object is achieved according to the invention for a vertical Hall effect sensor of the type mentioned initially in that the Hall effect sensor has three or more arm sections which are arranged at equal angular intervals from one another and which run together in a central section, in that each arm has an outer current electrode which is arranged opposite a central inner current electrode in the central section, with these current electrodes in each case forming the said pair of current electrodes, and in that a Hall effect voltage contact is arranged between the respective outer current electrodes and the central inner current electrode to allow a current flow between the current electrodes in each arm section of the semiconductor crystal, which current flow produces a number of output signals from the Hall effect sensor (for a magnetic field aligned parallel to the surface) corresponding to the number of arms and with an appropriately predetermined angle dependency.

Since various arms each form a complete Hall effect sensor, the Hall effect sensor can be made sensitive in a very accurate manner to different angles of the magnetic field in the plane of the crystal surface. The integrated design results not only in excellent accuracy with regard to the angles of the sensors to one another due to use of the same crystal surface, but also in sensitivity for the same components of the magnetic field.

The further object according to the invention is achieved for an electric motor of the type mentioned initially in that the Hall effect sensor is a vertical Hall effect sensor according to the invention having at least three arms, in that the number of arms corresponds to the number of coils so that at least three Hall effect voltages which are phase-shifted with the same phase interval between one another can be produced by the vertical Hall effect sensor when the motor shaft is rotating, which Hall effect voltages can be supplied after amplification to the coils as a power signal.

The use of the vertical Hall effect sensor according to the invention in a brushless electric motor allows very simple circuitry to be achieved for this electric motor, and this is highly advantageous for miniaturization of the overall unit.

Further advantageous embodiments are characterized in the respective dependent claims.

The invention will now be described in detail using various exemplary embodiments of the invention and with reference to the attached drawings.

DETAILED DESCRIPTION OF THE PREFERRED EMBODIMENTS

Figure 1:
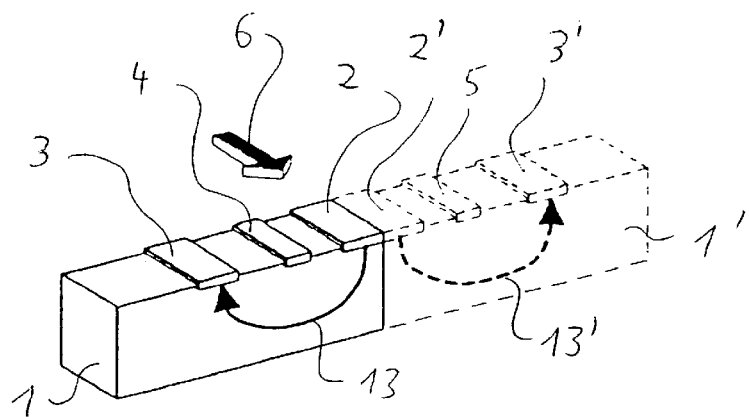
FIG. 1 shows a known linear vertical Hall effect sensor with a development in terms of the signal tapping.

FIG. 1 shows a known vertical Hall effect sensor, whose basic principles are described in U.S. Pat. No. 4,987,467. This document is hereby incorporated by reference in the present disclosure as a reference to the design of such a sensor.

A semiconductor crystal 1 is the basis for the Hall effect element or the Hall effect sensor, with this crystal 1 being cuboid, and with opposite sides thus running parallel. The reference symbols 2 and 3 denote the current electrodes applied to the surface of the crystal 1. A first sensor contact 4 is arranged between these current electrodes, with all three contacts and electrodes being in the form of strips and running parallel to one another. A so-called vertical Hall effect element, described in U.S. Pat. No. 4,987,467, then also has the part of the crystal 1' shown by dashed lines and having the first inner current electrode 2', the second outer current electrode 3' and a second sensor contact 5. Within the crystal material 1, a more conductive connection 13 is formed between the current electrodes 2 and 3, and a more conductive connection 13' is formed between the current electrodes 2' and 3'. When a magnetic field oriented in a corresponding way to the arrow 6 is applied to this so-called vertical Hall effect sensor, this results in a Hall effect voltage between the two sensor electrodes 4 and 5, with the various connecting levels between the contact points 4 and 5, the contact points 2, 2' and 3, 3' and the magnetic field 6 each running at right angles in this case as well. The inner current electrodes 2 and 2' are integral, and form a strip.

It is now possible to dispense with the part of the vertical Hall effect sensor shown by dashed lines, and thus to operate with only one half, provided a second tapping for the Hall effect voltage is provided on the rear face of the sensors.

Figure 2:
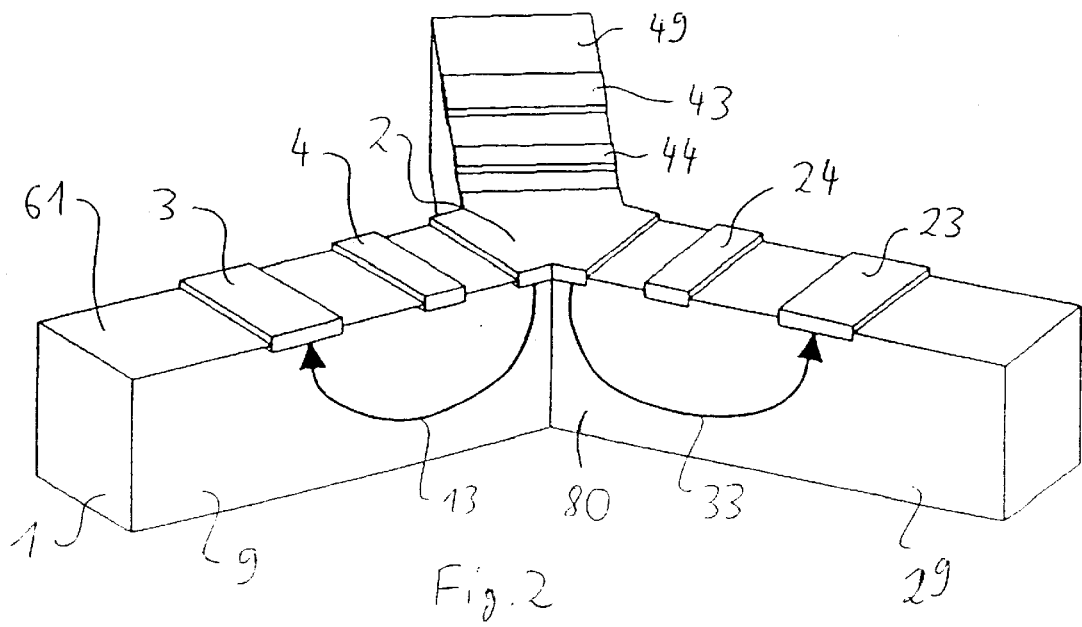
FIG. 2 shows a view of a three-armed Hall effect sensor according to one exemplary embodiment of the invention.

FIG. 2 shows a view of a three-armed vertical Hall effect sensor in accordance with the present invention, with the same features being denoted by the same reference symbols in each case in all the figures. The single central current electrode 2 is intended to act for all three arms 9, 29 and 49. The outer current electrodes 3, 23 and 43 are arranged facing this current electrode 2. The sensor contacts or Hall effect voltage electrodes 4, 24 and 44 are each arranged between the central electrode 2 and the outer electrodes 3, 23 and 43, respectively. Apart from the first layer profile of the more conductive layer 13 in the first arm 9, the figure also shows the corresponding layer routing 33 in the second arm 29.

In accordance with U.S. Pat. No. 4,987,467, this conductive layer can be provided in a wide range of configurations and may also comprise, in particular, the provision of a highly conductive so-called buried layer of the same conductance type as the semiconductor forming the crystal 1.

Figure 3:
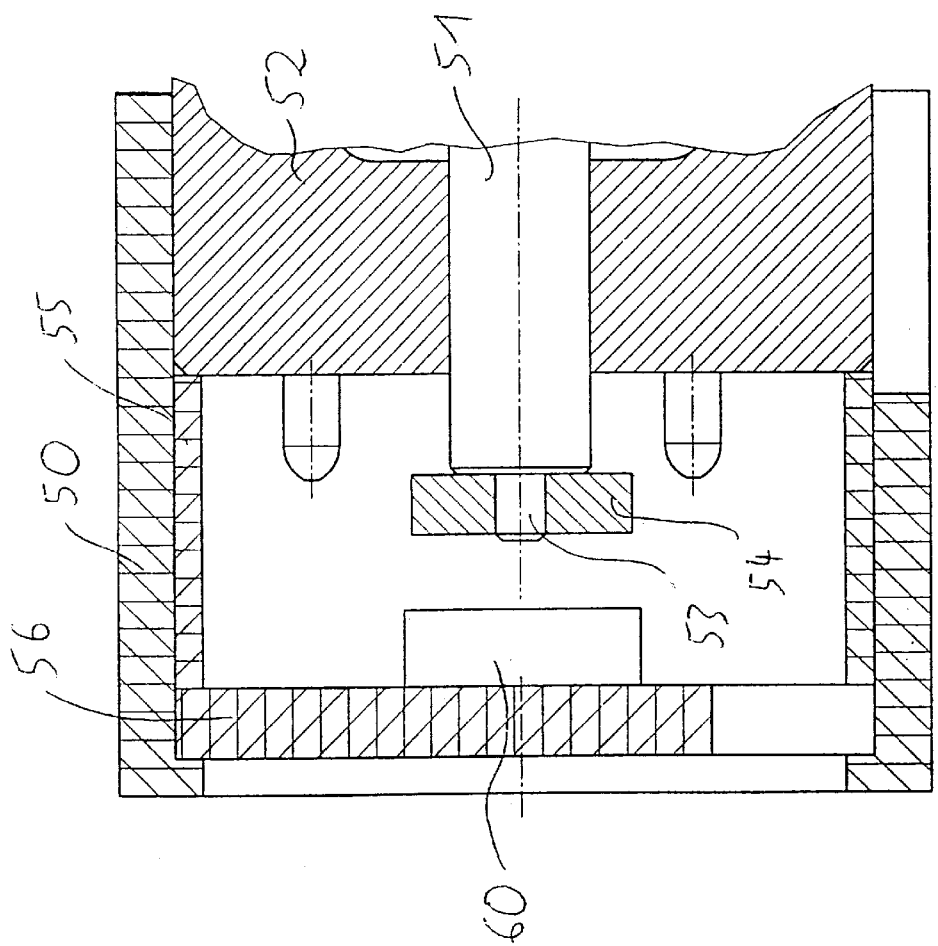
FIG. 3 shows a cross-sectional view through a miniaturized electric motor having a multi-armed vertical Hall effect sensor according to the invention and as shown in FIG. 2.

FIG. 3 now shows a view of a miniature motor which is arranged inside a housing 50. The reference symbol 51 denotes the shaft, which is mounted in a sleeve 52. A permanent magnet 54 is arranged on a projection 53 on the shaft 51, such that they rotate together. The permanent magnet 54 is cylindrical and has a hole. The vertical multiarmed Hall effect sensor 60 is arranged facing it and at as short a distance as possible from it, and may be designed, in particular, in accordance with FIG. 2, with the crystal surface, which is denoted by the reference symbol 61 in FIG. 2, being aligned with the permanent magnet 54.

A tubular spacer 55 is advantageously placed on the housing 52, on which spacer 55 a printed circuit board 56 which is fitted with the sensor 60 is placed and is held by the housing 50. In consequence, the magnet 54 and sensor 60 can be aligned accurately parallel in a simple manner.

Figure 4:
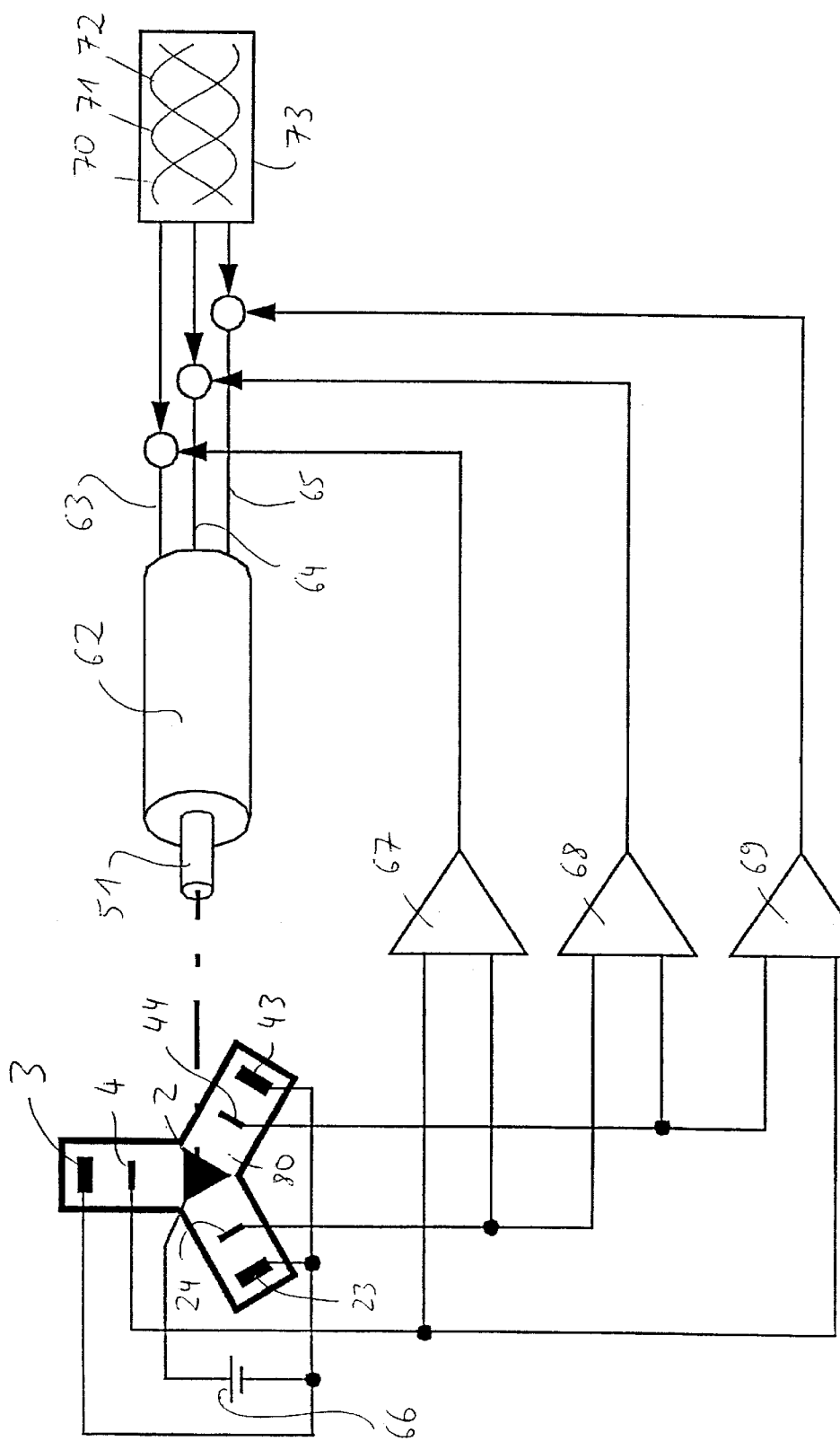
FIG. 4 shows a schematic view of a circuit diagram for driving the motor shown in FIG. 3 and having the three-armed vertical Hall effect sensor shown in FIG. 2.

The circuitry of the motor shown in FIG. 3 is now illustrated in FIG. 4, which shows a fundamental circuit diagram for an electric motor according to the invention. The electric motor 62 has three coils, which have supply leads 63, 64 and 65. The reference symbol 51 once again denotes the shaft to which the permanent magnet 60 is fitted, and the three-armed vertical Hall effect sensor is arranged facing it, in a schematic stylized plan view illustration. The outer current electrodes 3, 23 and 43 are interconnected, and are connected via an electrical power source 66 to the inner current electrode 2. The three voltage electrodes 4, 24 and 44 are respectively connected to first inputs of amplifier stages 67, 68 and 69. The other inputs of the amplifiers 67, 68 and 69 are each connected to voltage electrodes that follow in the counterclockwise direction. The amplifier stages 67, 68 and 69 thus have Hall effect voltages, which are each phase-shifted through 120°, applied to them from the three independent Hall effect sensors in the vertical Hall effect sensor. These three signals 70, 71 and 72 are shown schematically in the element 73. These signals are preferably appropriately amplified in the amplifiers 67, 68 and 69 such that they can be passed directly to the supply leads 63, 64 and 65, so that the brushless and preferably miniaturized electric motor 62 is driven without any further electrical supply circuit. The Hall effect voltages which can be produced by a multiarmed vertical Hall effect sensor according to the invention may thus be used, after amplification, as a power signal for an electric motor.

The element 73 may be an additional external voltage source, which produces three phase-shifted signals 70, 71 and 72 which it provides for starting and/or for mixing with the signals from the amplifier stages 67, 68 and 69 for the electric motor 62.

Figure 5:
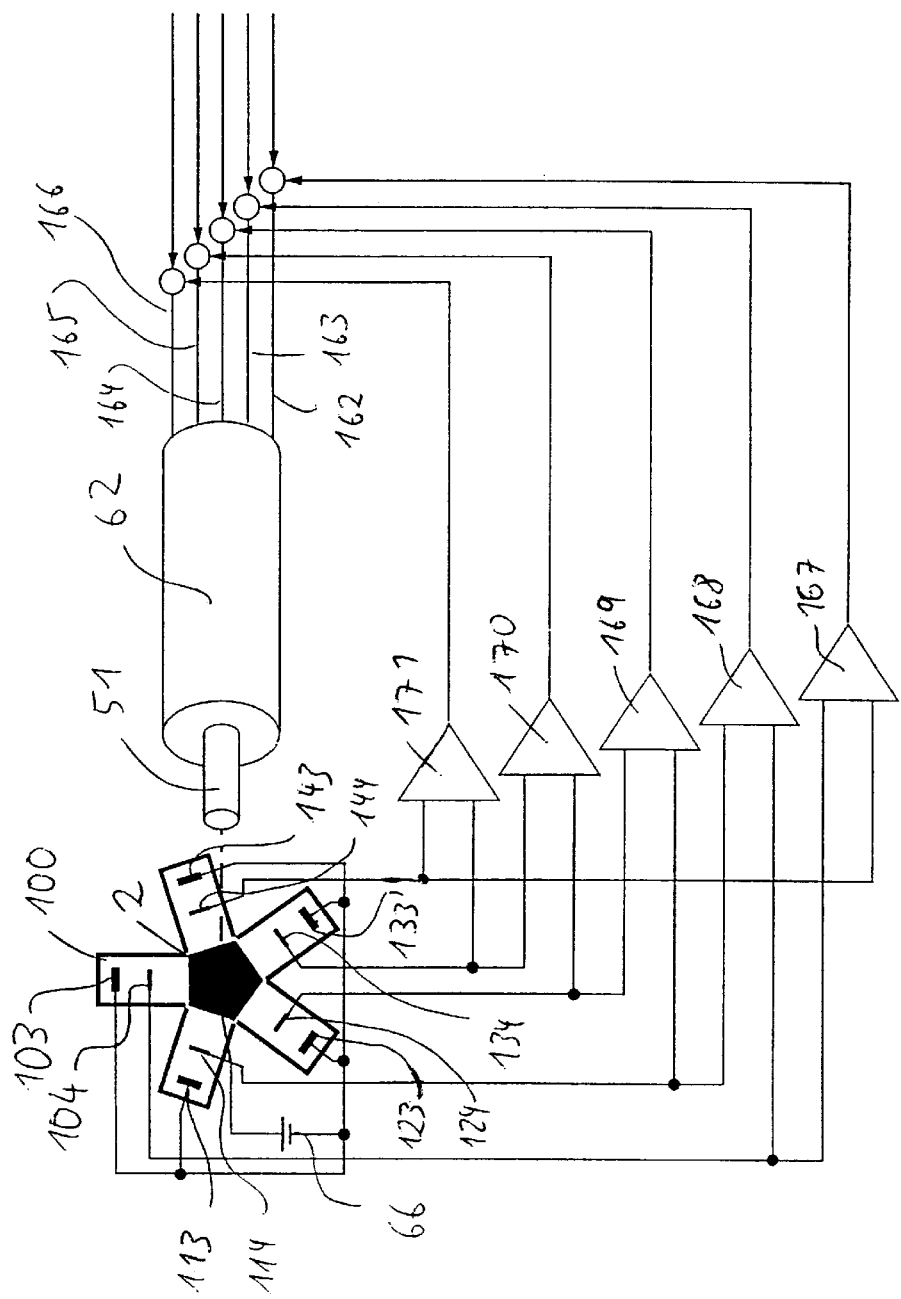
FIG. 5 shows a schematic view of a circuit diagram for driving an electric motor which comprises five coils and has a five-armed vertical Hall effect sensor according to a further exemplary embodiment of the invention.

Apart from the three-armed Hall effect sensor 80 shown in FIG. 4, any other multiarmed configuration of the Hall effect sensor is likewise possible. FIG. 5 shows a circuit diagram, corresponding to FIG. 4, of a five-armed Hall effect sensor 100. There are now five outer current electrodes 103, 113, 123, 133 and 143 adjoining the central current electrode 2. All the outer current electrodes are in turn connected to the inner current electrode 2 via an electrical power source 66. Hall effect voltage electrodes 104, 114, 124, 134 and 144 are arranged between the respective current electrode pairs 2 and 103, 113, 123, 133 and 143. Analogously to FIG. 4, a number of amplifier stages, in this case five, 167, 168, 169, 170 and 171 are provided, corresponding to the number of arms. In this case as well, there are corresponding supply leads from the five amplifiers to the five coil supplies 162, 163, 164, 165 and 166 for the electric motor 62.

In each of the exemplary embodiments of a vertical Hall effect sensor described above, a constant current was introduced via the electrodes 2 and 3, 23, 43, and the Hall effect voltage was tapped off. This procedure always leads to phase-shifted output signals, which oscillate about 0 volts and thus essentially have no DC voltage components. In contrast, when the described Hall effect sensors are operated at a constant voltage, and thus with a variable current, the output voltage oscillates about a value other than 0, for example 3 volts, that is to say with a DC voltage component.

Apart from the illustrated capability to form differences in the amplifier stages 67 and 167 et seq., each output signal from the Hall effect voltage contacts can also be amplified and supplied to the motor 62 individually. This situation, which is not shown in the drawings, leads to a shift in the Hall effect voltages for different magnetic field strengths, that is to say the output voltages at the "zero crossings" of the three-armed sensors at 0 and 180, 60 and 240, or 120 and 300 degrees are not the same, for different magnetic field strengths.

The Hall effect sensor according to the invention can be used for other applications, in addition to the described use for driving micromotors, in all those areas in which Hall effect sensors operating in various orientations are required in a confined space. Apart from the illustrated three-armed and five-armed vertical Hall effect sensors, any other number of sensor arms greater than three is also possible.

The sensor per se has the advantage that it is an integrated sensor which does not cause any problems whatsoever in its production with regard to the parallel and in this case flush alignment of the planes of the contact surfaces, in this case in the surface 61. The alignment and size of the contact surfaces themselves can also be predetermined very accurately. As a result of the integration process, the angle of 120° between adjacent arms for the three-armed sensor as shown in FIG. 2, and the angle of 72° between adjacent arms for the five-armed sensor which is shown in FIG. 5 can be produced with very high accuracy.

If the Hall effect sensor has an even number of arms, for example six, mutually opposite Hall effect sensor arms are interconnected to form a complete vertical Hall effect sensor as shown in FIG. 1, in addition to the Hall effect voltage sensitivities, of which there are six at phase intervals of 60 degrees in this case, in the manner described in conjunction with the figures. The example with six arms chosen in this section then results in three Hall effect voltage sensitivities at phase intervals of 120 degrees to one another, as in the three-armed Hall effect sensor shown in FIG. 2. However, the circuit complexity is considerably greater. The advantage of the solution shown in FIGS. 2 and 3 is, in particular, also the fact that considerably fewer contacts are required, and the circuitry of the sensor can be simpler.

What is claimed is:

1. A vertical Hall effect sensor, comprising:
   a semiconductor crystal having a pair of current electrodes arranged on a surface thereof and having a Hall effect voltage contact arranged between the pair of current electrodes,
   wherein the semiconductor crystal has sufficient thickness to allow a current flow between the pair of current electrodes in the semiconductor crystal, which current flow makes the Hall effect sensor sensitive to a magnetic field aligned parallel to the surface,
   wherein the Hall effect sensor has at least three arm sections which are arranged at equal angular intervals from one another and which run together in a central section,
   wherein each of the arm sections has an outer current electrode which is arranged opposite a central inner current electrode in the central section, with the outer current electrodes in each case forming the pair of current electrodes,
   wherein a Hall effect voltage contact is arranged between the respective outer current electrodes and the central inner current electrodes to allow a current flow between the outer current electrodes in each of the arm sections of the semiconductor crystal, which current flow produces a plurality of output signals from the Hall effect sensor for a magnetic field aligned parallel to the surface corresponding to the number of arm sections and with a predetermined angle dependency, and
   wherein the three arm sections are arranged at an angle of 120° to one another.

2. The vertical Hall effect sensor as claimed in claim 1, wherein a buried layer is provided in each of the arm sections of the semiconductor crystal for producing the current flow.

3. The vertical Hall effect sensor as claimed in claim 1, wherein the outer current electrodes are electrically conductive strips, and wherein the Hall effect voltage contacts are electrically conductive strips arranged parallel to the outer current electrodes.

4. The vertical Hall effect sensor as claimed in claim 1, wherein a buried layer is provided in each of the arm sections of the semiconductor crystal for producing the current flow.

5. The vertical Hall effect sensor as claimed in claim 1, wherein the outer current electrodes are electrically conductive strips, and wherein the Hall effect voltage contacts are electrically conductive strips arranged parallel to the outer current electrodes.

6. The vertical Hall effect sensor as claimed in claim 2, wherein the outer current electrodes are electrically conductive strips, and wherein the Hall effect voltage contacts are electrically conductive strips arranged parallel to the outer current electrodes.

7. A vertical Hall effect sensor, comprising:
   a semiconductor crystal having a pair of current electrodes arranged on a surface thereof and having a Hall effect voltage contact arranged between the pair of current electrodes,
   wherein the semiconductor crystal has sufficient thickness to allow a current flow between the pair of current electrodes in the semiconductor crystal, which current flow makes the Hall effect sensor sensitive to a magnetic field aligned parallel to the surface,
   wherein the Hall effect sensor has at least five arm sections which are arranged at equal angular intervals from one another and which run together in a central section,
   wherein each of the arm sections has an outer current electrode which is arranged opposite a central inner current electrode in the central section, with the outer current electrodes in each case forming the pair of current electrodes,
   wherein a Hall effect voltage contact is arranged between the respective outer current electrodes and the central inner current electrodes to allow a current flow between the outer current electrodes in each of the arm sections of the semiconductor crystal, which current flow produces a plurality of output signals from the Hall effect sensor for a magnetic field aligned parallel to the surface corresponding to the number of arm sections and with a predetermined angle dependency, and
   wherein the five arm sections are arranged at an angle of 72° to one another.

* * * * *

UNITED STATES PATENT AND TRADEMARK OFFICE
CERTIFICATE OF CORRECTION

PATENT NO.    : 6,542,068 B1                              Page 1 of 1
DATED         : April 1, 2003
INVENTOR(S)   : Axel Drapp et al.

It is certified that error appears in the above-identified patent and that said Letters Patent is hereby corrected as shown below:

<u>Column 1,</u>
Line 10, "comprising a semiconductor" should read -- including a semiconductor --.

Signed and Sealed this

Sixteenth Day of September, 2003

JAMES E. ROGAN
*Director of the United States Patent and Trademark Office*